(12) United States Patent
Xiong et al.

(10) Patent No.: US 11,114,946 B2
(45) Date of Patent: Sep. 7, 2021

(54) VOLTAGE REGULATOR MODULE

(71) Applicant: Delta Electronics, Inc., Taoyuan (TW)

(72) Inventors: Yahong Xiong, Taoyuan (TW);
Shaojun Chen, Taoyuan (TW); Da Jin, Taoyuan (TW); Qinghua Su, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/810,544

(22) Filed: Mar. 5, 2020

(65) Prior Publication Data
US 2020/0304036 A1 Sep. 24, 2020

(30) Foreign Application Priority Data

Mar. 18, 2019 (CN) .......................... 201910204152.6

(51) Int. Cl.
*H01F 27/24* (2006.01)
*H02M 7/00* (2006.01)
*H05K 1/18* (2006.01)

(52) U.S. Cl.
CPC ............ *H02M 7/003* (2013.01); *H01F 27/24* (2013.01); *H05K 1/181* (2013.01); *H05K 2201/1003* (2013.01); *H05K 2201/10053* (2013.01)

(58) Field of Classification Search
CPC .................. H02M 7/003; H05K 1/181; H05K 2201/1003; H05K 2201/10053; H01F 27/24; H01F 2027/065; H01F 2017/067; H01F 2017/065; H01F 27/266

USPC ......................................................... 361/782
See application file for complete search history.

(56) References Cited

U.S. PATENT DOCUMENTS

| 8,094,458 | B2 | 1/2012 | Furnival |
| 8,427,269 | B1 | 4/2013 | Vinciarelli et al. |
| 8,966,747 | B2 | 3/2015 | Vinciarelli et al. |
| 9,387,633 | B1 | 7/2016 | Vinciarelli et al. |
| 9,516,761 | B2 | 12/2016 | Vinciarelli et al. |
| 9,936,580 | B1 | 4/2018 | Vinciarelli et al. |

(Continued)

FOREIGN PATENT DOCUMENTS

| CN | 1378415 A | 11/2002 |
| CN | 2629393 Y | 7/2004 |

(Continued)

*Primary Examiner* — Sherman Ng
(74) *Attorney, Agent, or Firm* — Kirton McConkie; Evan R. Witt

(57) ABSTRACT

A voltage regulator module includes a circuit board assembly and a magnetic core assembly. The circuit board assembly includes a printed circuit board and at least one switch element. A first concave structure is concavely formed on a second surface of the printed circuit board. At least one protrusion post is disposed within the first concave structure. A pin as a positive output terminal, a pin as a positive input terminal and a pin as a negative output terminal are disposed on the second surface of the printed circuit board. The switch element is disposed on a first surface of the printed circuit board. The magnetic core assembly is accommodated within the first concave structure, and includes at least one opening. The protrusion post is penetrated through the corresponding opening. Consequently, at least one inductor is defined by the at least one protrusion post and the magnetic core assembly collaboratively.

16 Claims, 8 Drawing Sheets

(56) References Cited

U.S. PATENT DOCUMENTS

| | | | |
|---|---|---|---|
| 10,264,664 B1 | 4/2019 | Vinciarelli et al. | |
| 2006/0022788 A1* | 2/2006 | Sasamori | H01F 17/043 |
| | | | 336/208 |
| 2006/0197510 A1 | 9/2006 | Chandrasekaran | |
| 2010/0007451 A1* | 1/2010 | Yan | H01F 17/043 |
| | | | 336/90 |
| 2010/0013587 A1* | 1/2010 | Yan | H01F 27/306 |
| | | | 336/192 |
| 2011/0273257 A1* | 11/2011 | Ishizawa | H01F 17/043 |
| | | | 336/192 |
| 2016/0268034 A1 | 9/2016 | Subat et al. | |
| 2016/0302312 A1 | 10/2016 | Vinciarelli et al. | |
| 2017/0104419 A1* | 4/2017 | Zeng | H02M 7/537 |
| 2018/0122562 A1* | 5/2018 | Ji | H05K 1/185 |
| 2020/0173013 A1 | 6/2020 | Nguyen et al. | |
| 2020/0304036 A1 | 9/2020 | Xiong et al. | |

FOREIGN PATENT DOCUMENTS

| | | |
|---|---|---|
| CN | 101996759 A | 3/2011 |
| CN | 201936720 U | 8/2011 |
| CN | 102360787 A | 2/2012 |
| CN | 103475226 A | 12/2013 |
| CN | 103956250 A | 7/2014 |
| CN | 106533179 A | 3/2017 |
| CN | 107437885 A | 12/2017 |
| CN | 108022917 A | 5/2018 |
| GB | 2471497 A | 1/2011 |
| JP | 2009177019 A | 8/2009 |
| WO | 2014206460 A1 | 12/2014 |

\* cited by examiner

VOLTAGE REGULATOR MODULE

FIELD OF THE INVENTION

The present disclosure relates to a voltage regulator module, and more particularly to a voltage regulator module with reduced volume.

BACKGROUND OF THE INVENTION

Please refer to FIGS. 1A and 1B. FIG. 1A schematically illustrates the structure of a conventional electronic device. FIG. 1B schematically illustrates the structure of a voltage regulator module of the electronic device as shown in FIG. 1A. As shown in FIGS. 1A and 1B, the electronic device 1 has a horizontal layout structure. The electronic device 1 includes a central processing unit (CPU) 11, a voltage regulator module 12, a system board 13 and an output capacitor 14. The voltage regulator module 12 is used for converting an input voltage into a regulated voltage and providing the regulated voltage to the central processing unit 11. The voltage regulator module 12 and the central processing unit 11 are disposed on a first surface of the system board 13. For meeting the load dynamic switching requirements, the output terminal of the voltage regulator module 12 is located near the input terminal of the central processing unit 11. The output capacitor 14 is disposed on a second surface of the system board 13. The first surface and the second surface of the system board 13 are opposed to each other. The output capacitor 14 is located beside the input terminal of the central processing unit 11.

The voltage regulator module 12 further includes a printed circuit board 15 and a magnetic element 16. The magnetic element 16 is disposed on the printed circuit board 15. Moreover, a switch element is disposed in a vacant space between the printed circuit board 15 and the magnetic element 16. The printed circuit board 15 is disposed on the first surface of the system board 13. The heat from the voltage regulator module 12 can be transferred to the system board 13 through the printed circuit board 15. Moreover, the heat is dissipated away through a heat dissipation mechanism (not shown) of the system board 13.

Recently, the required current for the central processing unit 11 is gradually increased. In addition, the trend of the volume of the electronic device is toward miniaturization. Since the central processing unit 11 and the voltage regulator module 12 are located at the same side of the system board 13, the electronic device cannot meet the load dynamic switching requirements.

For reducing the volume of the electronic device and effectively enhancing the dynamic switching performance of the voltage regulator module, another electronic device is disclosed. FIG. 2 schematically illustrates the structure of another conventional electronic device. The electronic device 1' of FIG. 2 has the vertical layout structure. The voltage regulator module 12 is disposed on the second surface of the system board 13, so that the voltage regulator module 12 and the central processing unit 11 are disposed on opposed surfaces of the system board 13. Consequently, the volume of the electronic device 1' is effectively reduced. Moreover, since the output capacitor 14 is located near the output terminal of the voltage regulator module 12 and the input terminal of the central processing unit 11, the dynamic switching performance of the voltage regulator module 12 is enhanced.

Although the dynamic switching performance of the voltage regulator module of the electronic device 1' as shown in FIG. 2 is enhanced, there are still some drawbacks. For example, since the magnetic element 16 and the switch element of the voltage regulator module 12 are disposed on the same side of the printed circuit board 15 and the switch element is disposed in the vacant space between the printed circuit board 15 and the magnetic element 16, it is difficult to optimize the structure and the size of the magnetic element 16 of the voltage regulator module 12. In other words, the size of the voltage regulator module 12 in the electronic device 1' is still large. Moreover, when the voltage regulator module 12 on the system board undergoes a reflow soldering process, the inner components to be reheated are possibly detached or shifted.

Therefore, there is a need of providing an improved voltage regulator module in order to overcome the drawbacks of the conventional technologies.

SUMMARY OF THE INVENTION

An object of the present disclosure provides a voltage regulator module with reduced size.

Another object of the present disclosure provides a voltage regulator module that is manufactured by a simplified fabricating process.

In accordance with an aspect of the present disclosure, a voltage regulator module is provided. The voltage regulator module includes a circuit board assembly and a magnetic core assembly. The circuit board assembly includes a printed circuit board and at least one switch element. The printed circuit board has a first surface and a second surface which are opposed to each other, the printed circuit board comprises a first concave structure and at least one protrusion post. The first concave structure is concavely formed on the second surface of the printed circuit board. The protrusion post is disposed within the first concave structure. The protrusion post has internal traces. A pin as a positive input terminal, a pin as a positive output terminal and a pin as a negative output terminal of the voltage regulator module are disposed on the second surface of the printed circuit board. The at least one switch element is disposed on the first surface of the printed circuit board. The magnetic core assembly is accommodated within the first concave structure, and includes at least one opening. The protrusion post is penetrated through the corresponding opening. Consequently, at least one inductor is defined by the at least one protrusion post and the magnetic core assembly collaboratively.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
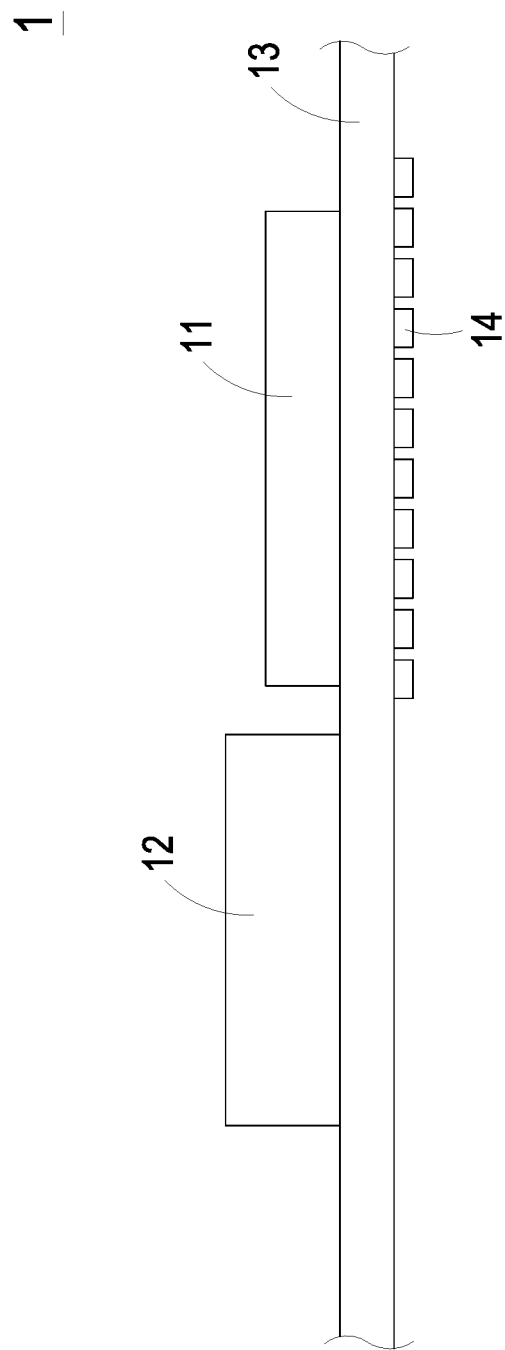
FIG. 1A schematically illustrates the structure of a conventional electronic device.
Figure 1B:
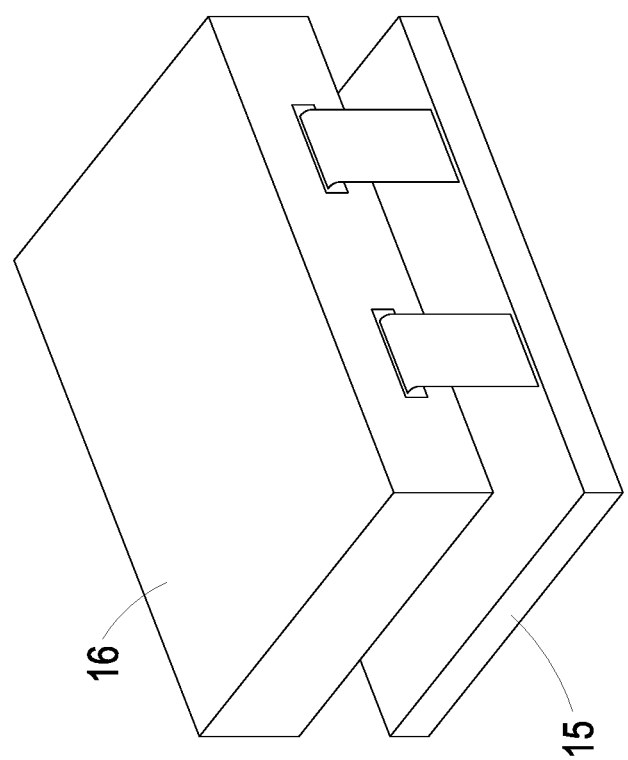
FIG. 1B schematically illustrates the structure of a voltage regulator module of the electronic device as shown in FIG. 1A.
Figure 2:
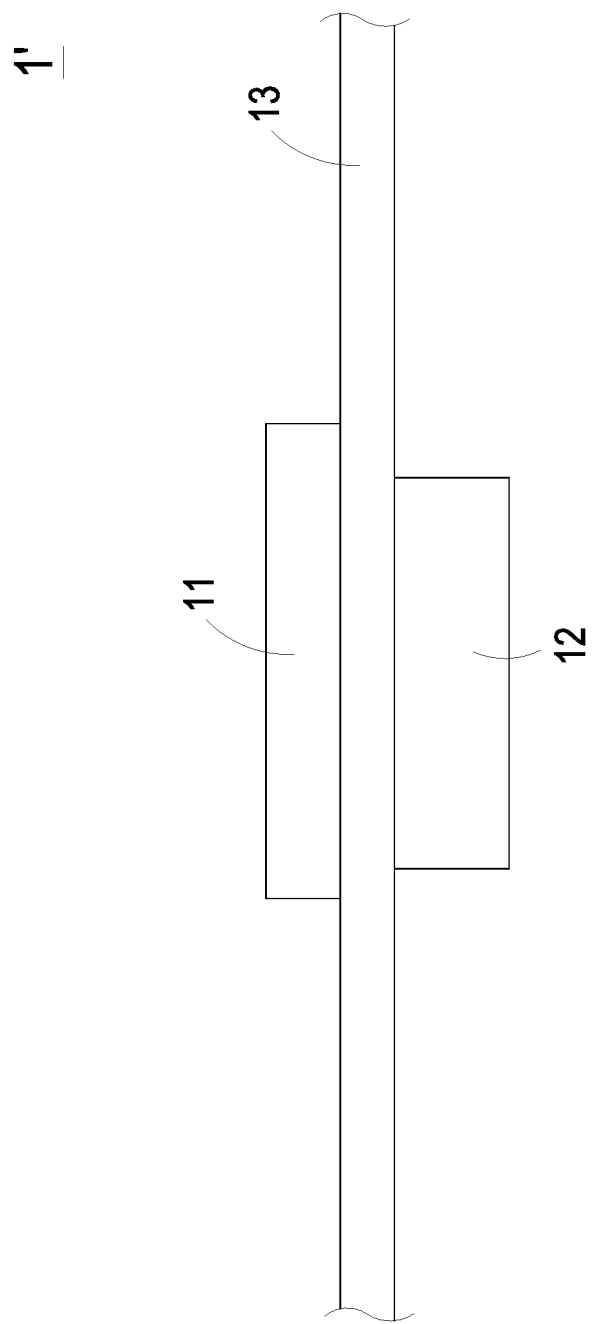
FIG. 2 schematically illustrates the structure of another conventional electronic device.
Figure 3A:
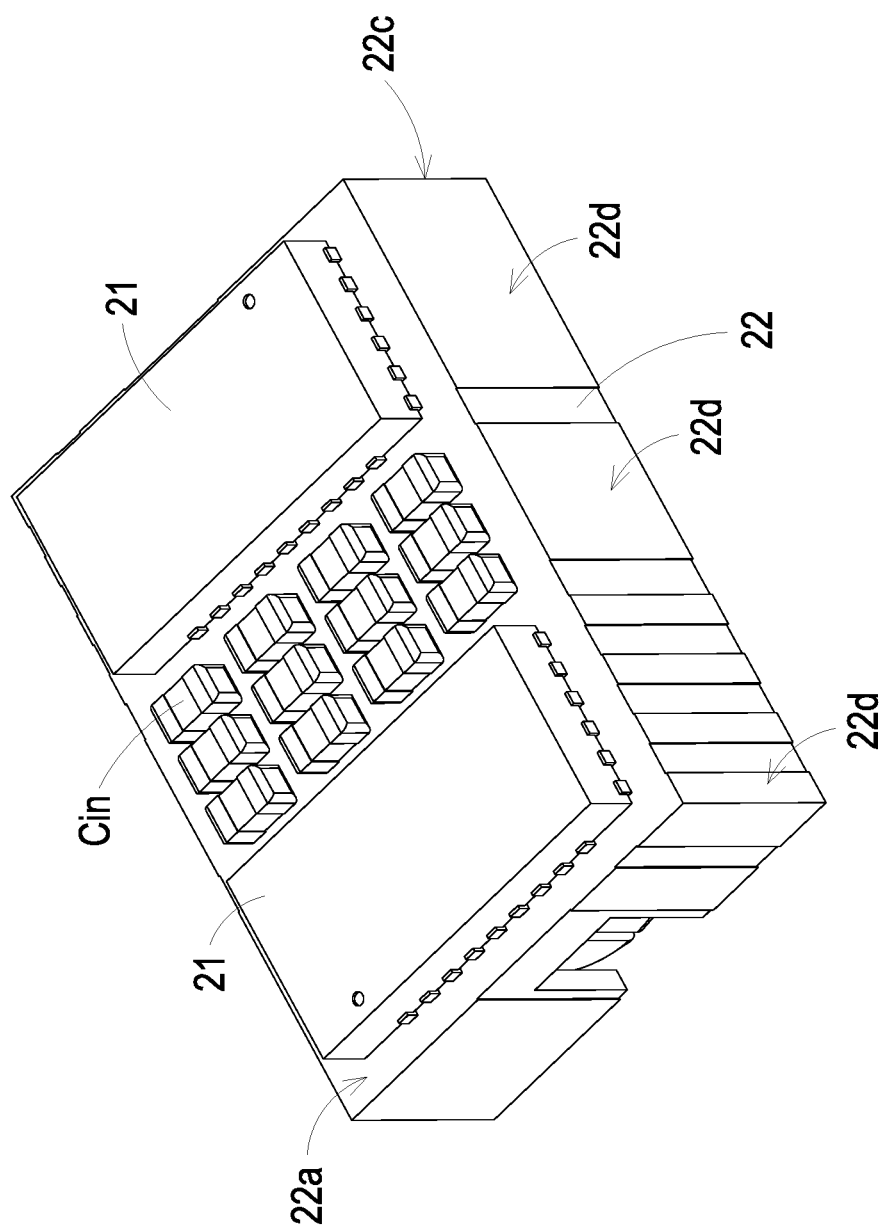
FIG. 3A is a schematic perspective view illustrating a voltage regulator module according to a first embodiment of the present disclosure and taken along a viewpoint.
Figure 3B:
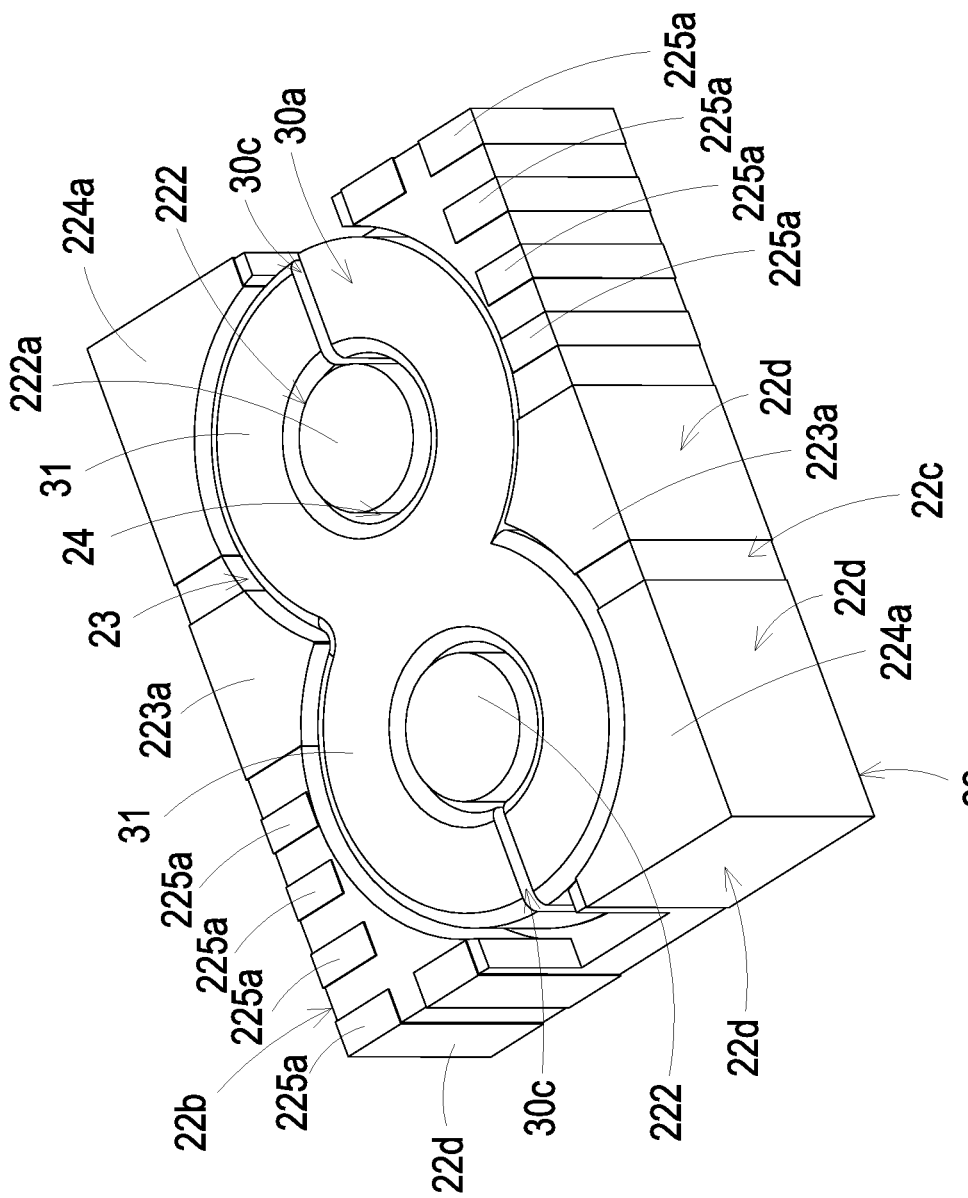
FIG. 3B is a schematic perspective view illustrating the voltage regulator module of FIG. 3A and taken along another viewpoint.
Figure 3C:
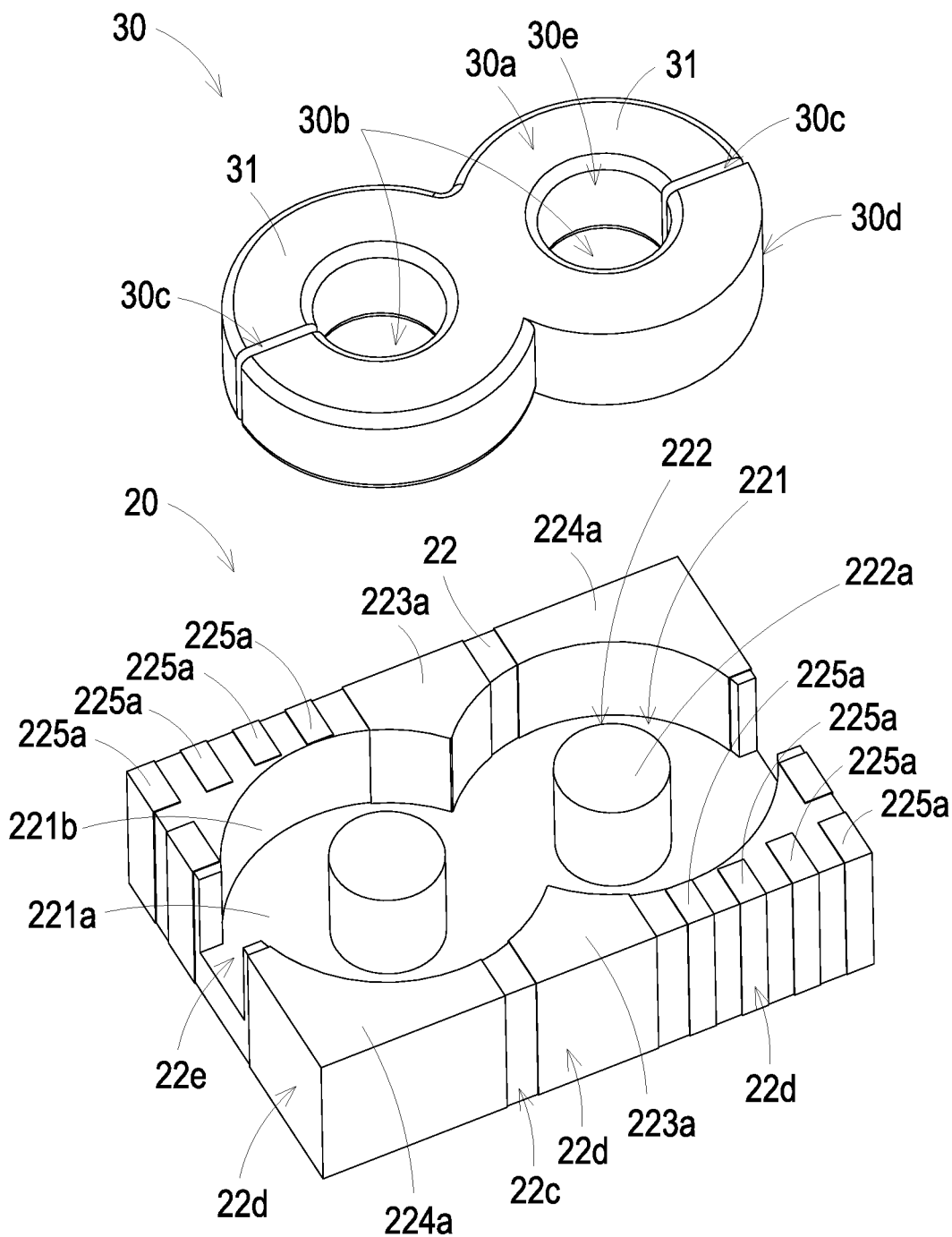
FIG. 3C is a schematic exploded view illustrating the voltage regulator module of FIG. 3B.
Figure 4:
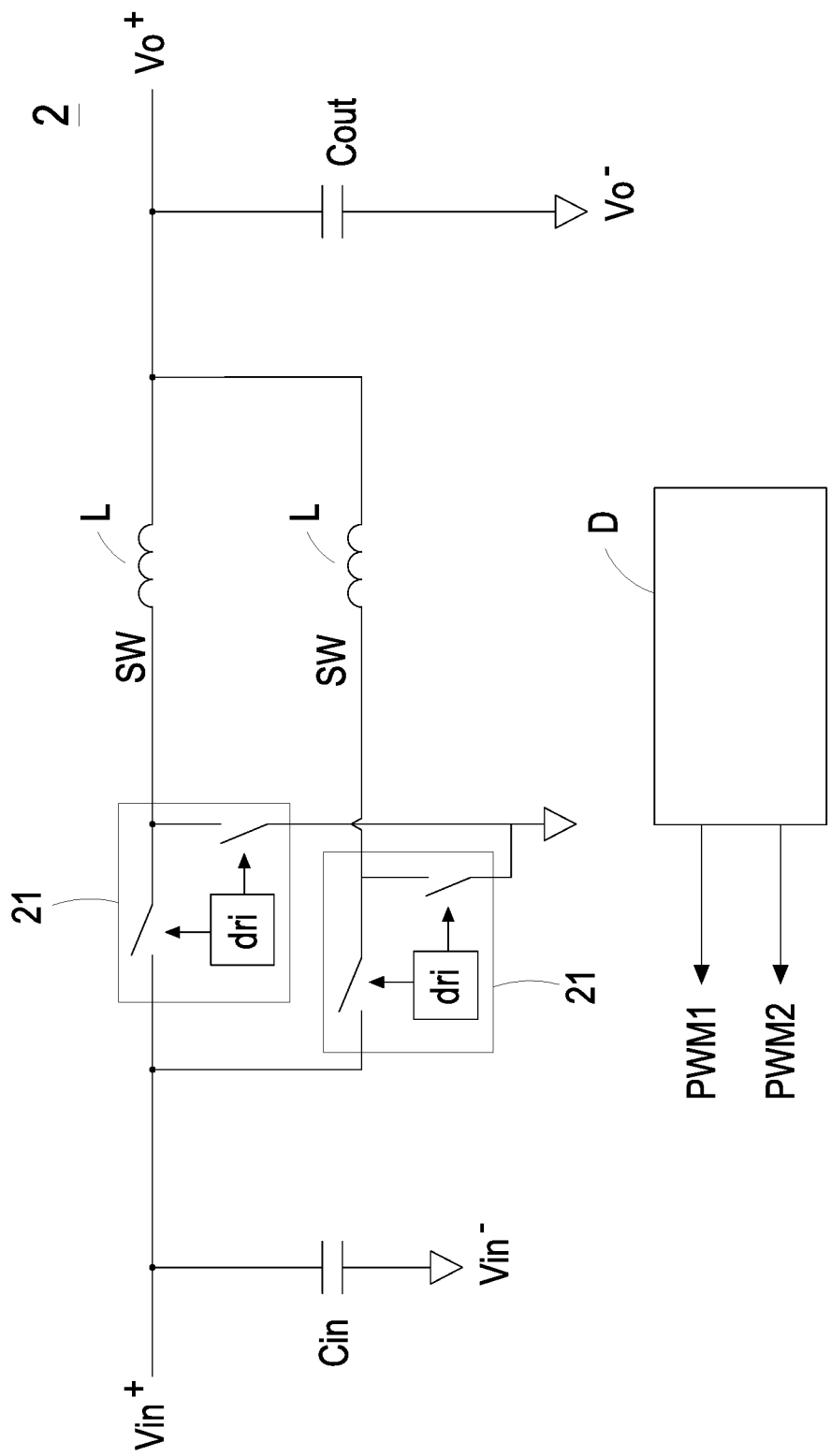
FIG. 4 is a schematic equivalent circuit diagram illustrating the voltage regulator module of FIG. 3A.

Please refer to FIGS. 3A, 3B, 3C and 4. FIG. 3A is a schematic perspective view illustrating a voltage regulator module according to a first embodiment of the present disclosure and taken along a viewpoint. FIG. 3B is a schematic perspective view illustrating the voltage regulator module of FIG. 3A and taken along another viewpoint. FIG. 3C is a schematic exploded view illustrating the voltage regulator module of FIG. 3B. FIG. 4 is a schematic equivalent circuit diagram illustrating the voltage regulator module of FIG. 3A. The voltage regulator module 2 may be installed in an electronic device and welded on a system board (not shown) within the electronic device. The voltage regulator module 2 is at least one phase buck converter and includes at least one switch element 21, at least one inductor L, at least one input capacitor Cin and at least one output capacitor Cout. For example, the switch element 21 is a driver and metal-oxide-semiconductor field-effect transistor (also referred as a Dr.MOS element 21). In case that the central processing unit of the electronic device requires a large amount of current, the voltage regulator module 2 is a multi-phase buck converter. Consequently, the capability of the voltage regulator module 2 to output electricity is effectively enhanced.

In the embodiment of FIG. 4, the voltage regulator module 2 is a two-phase buck converter. The voltage regulator module 2 includes two Dr.MOS elements 21 and two inductors L. Each Dr.MOS element 21 and a first terminal SW of the corresponding inductor L are electrically connected with each other in series to define a phase buck circuit. In this embodiment, the voltage regulator module 2 includes two phase buck circuits. The input side of the voltage regulator module 2 includes a positive input terminal Vin+ and a negative input terminal Vin−. The first terminals of the two phase buck circuits are connected with each other in parallel and electrically connected with the input capacitor Cin. The output side of the voltage regulator module 2 includes a positive output terminal Vo+ and a negative output terminal Vo−. The negative input terminal Vin− and the negative output terminal Vo− are electrically connected with a common terminal. The second terminals of the two phase buck circuits are connected with each other in parallel and electrically connected with the output capacitor Cout. A first terminal of the output capacitor Cout is electrically connected with the positive output terminal Vo+ of the voltage regulator module 2. A second terminal of the output capacitor Cout is electrically connected with the negative output terminal Vo− of the voltage regulator module 2. A first terminal of the input capacitor Cin is electrically connected with the positive input terminal Vin+ of the voltage regulator module 2. A second terminal of the input capacitor Cin is electrically connected with the negative input terminal Vin− of the voltage regulator module 2.

In an embodiment, each Dr.MOS element 21 includes a switch and a driver for driving the switch. The voltage regulator module 2 further includes a control circuit D. After the control circuit D samples the output voltage of the voltage regulator module 2 and the output current of each phase buck circuit, the control circuit D generates two pulse width modulation signals PWM1 and PWM2. The phase difference between the two pulse width modulation signals PWM1 and PWM2 is 180 degree. The first phase buck circuit and the second phase buck circuit are controlled according to the first pulse width modulation signal PWM1 and the second pulse width modulation signal PWM2, respectively.

Please refer to FIG. 3C. Structurally, the voltage regulator module 2 includes a circuit board assembly 20 and a magnetic core assembly 30. The circuit board assembly 20 includes a printed circuit board 22 and at least one Dr.MOS element 21. The printed circuit board 22 has a first surface 22a and a second surface 22b, which are opposed to each other. The printed circuit board 22 includes a first concave structure 221 and at least one protrusion post 222. All Dr.MOS elements 21 and all input capacitors Cin are mounted on the first surface 22a of the printed circuit board 22 by a welding process or through a conductive adhesive (see FIG. 3A). In addition, the input capacitors Cin are electrically connected with the Dr.MOS elements 21. In this embodiment, the installation directions of the two Dr.MOS elements 21 on the first surface 22a of the printed circuit board 22 are opposed. Consequently, the input voltage pins of the two Dr.MOS elements 21 are arranged near each other. The input capacitors Cin are arranged between the two Dr.MOS elements 21. Consequently, the input capacitors Cin are shared by the two Dr.MOS elements 21. Consequently, the nearby input voltage pins of the two Dr.MOS elements 21 are electrically connected with each other, and the number of the input capacitors Cin is reduced. In some embodiments, the circuit board assembly 20 further includes a filter capacitor (not shown). The filter capacitor is disposed on the first surface 22a of the printed circuit board 22 for driving and powering the Dr.MOS elements 21.

The first concave structure 221 of the printed circuit board 22 is concavely formed on the second surface 22b of the printed circuit board 22 (e.g., in a middle region of the second surface 22b of the printed circuit board 22) by a milling process. While the first concave structure 221 is formed by the milling process, the at least one protrusion post 222 is formed in the first concave structure 221. An end of the protrusion post 222 is a portion of the second surface 22b and located at the middle region of the second surface 22b. Since the protrusion post 222 is the component of the printed circuit board 22, the protrusion post 222 has internal traces. Moreover, the positive output terminal, the positive input terminal and the negative output terminal of the voltage regulator module 2 are disposed on the second surface 22b of the printed circuit board 22. For forming the first concave structure 221, the printed circuit board 22 has a specified thickness (e.g., 3 mm).

The magnetic core assembly 30 is disposed in the first concave structure 221 on the second surface 22b of the printed circuit board 22 and includes a top surface 30a and at least one opening 30b corresponding to the at least one protrusion post 222. When the magnetic core assembly 30 is accommodated within the first concave structure 221 on the second surface 22b of the printed circuit board 22, the top surface 30a of the magnetic core assembly 30 is coplanar with the second surface 22b of the printed circuit board 22 or at the level lower than the second surface 22b of the printed circuit board 22. Each opening 30b of the magnetic core assembly 30 is corresponding in position to the protrusion post 222. While the magnetic core assembly 30 is accommodated within the first concave structure 221 on the second surface 22b of the printed circuit board 22, the at least one protrusion post 222 is penetrated through the corresponding opening 30b. Consequently, an inductor L is defined by the corresponding protrusion post 222 and the magnetic core assembly 30 collaboratively. In this embodiment, the voltage regulator module 2 is a two-phase buck converter. Consequently, the printed circuit board 22 includes two protrusion posts 222. Moreover, the magnetic core assembly 30 includes at least one ring-shaped core 31. Since the voltage regulator module 2 is a two-phase buck converter, the magnetic core assembly 30 includes two ring-shaped cores 31. Each ring-shaped core 31 has the corresponding opening 30b. The two protrusion posts 222 are penetrated through the corresponding openings 30b. Consequently, two inductors L are defined by the corresponding protrusion posts 222 and the corresponding ring-shaped cores 31 collaboratively.

As mentioned above, the Dr.MOS elements 21 and the magnetic core assembly 30 are disposed on two opposite sides of the printed circuit board 22. The protrusion posts 222 of the printed circuit board 22 are used as the windings, and the inductors L are defined by the corresponding windings and the magnetic core assembly 30 collaboratively. Consequently, the thickness and the size of the magnetic core assembly 30 can be effectively reduced. Moreover, since the magnetic core assembly 30 is accommodated within the first concave structure 221 of the printed circuit board 22, the height of the voltage regulator module 2 is substantially equal to the overall height of the printed circuit board 22 and the Dr.MOS elements 21. When compared with the conventional voltage regulator module, the size of the voltage regulator module 2 of the present disclosure can be further reduced.

Moreover, the printed circuit board 22 includes a plurality of pins 222a, 223a, 224a and 225a. In this embodiment, one pin 222a is formed on the surface of each protrusion post 222. The pins 222a of the two protrusion posts 222 are used as the positive output terminal of the printed circuit board 22. The pins 223a are used as the positive input terminal of the printed circuit board 22. The two pins 223a are symmetric with respect to the midpoint of the two protrusion posts 222, and located on the second surface 22b of the printed circuit board 22. Moreover, the two pins 223a are arranged beside the region between the two protrusion posts 222. The two pins 224a are used as the negative output terminal of the printed circuit board 22. The second surface 22b of the printed circuit board 22 has four corners. Two corners are arranged along a first diagonal line and symmetric with respect to the midpoint of the second surface 22b of the printed circuit board 22. The other two corners are arranged along a second diagonal line and symmetric with respect to the midpoint of the second surface 22b of the printed circuit board 22. The two pins 224a of the negative output terminal are located at the two corners along the first diagonal line of the second surface 22b of the printed circuit board 22, respectively. Moreover, the two pins 224a of the negative output terminal are opposed with respect to the at least one protrusion post 222. Moreover, two signal terminals are located at the two corners along the second diagonal line of the second surface 22b of the printed circuit board 22, respectively. When the voltage regulator module 2 is welded on the system board, the voltage regulator module 2 is in communication with the system board through the two signal terminals. As shown in FIGS. 3B and 3C, each signal terminal includes a plurality of pins 225a. Alternatively, in another embodiment, each signal terminal includes a single pin 225a.

In an embodiment, the positive output terminal, the positive input terminal, the negative output terminal and the signal terminals of the voltage regulator module 2 that are disposed on the second surface 22b of the printed circuit board 22 may be welded on the system board. That is, the second surface 22b of the printed circuit board 22 may be welded on the system board through the two pins 222a, the two pins 223a, the two pins 224a and the plurality of pins 225a. Since the voltage regulator module 2 is welded on the system board through these pins 222a, 223a, 224a and 225a, the electronic device with the voltage regulator module 2 has the vertical layout structure. In comparison with the conventional technology, the process of designing the associated terminals is simplified and the size of the voltage regulator module 2 is reduced.

In some embodiments, the printed circuit board 22 of the voltage regulator module 2 further includes a lateral wall 22c. The lateral wall 22c is arranged between the first surface 22a and the second surface 22b. Moreover, a plurality of electroplated blocks 22d are formed on the lateral wall 22c. The electroplated blocks 22d are aligned with the corresponding pins 223a of the positive input terminal, the corresponding pins 224a of the negative output terminal and the corresponding pins 225a of the signal terminals, respectively. When the voltage regulator module 2 on the system board undergoes a reflow soldering process, the electroplated blocks 22d corresponding to the pins 223a, 224a and 225a can provide lateral wetting capability. Consequently, the welding strength of the combination between the voltage regulator module 2 and the system board is enhanced.

Please refer to FIG. 3C again. The first concave structure 221 on the second surface 22b of the printed circuit board 22 includes a bottom 221a and a wall surface 221b. A copper layer in the printed circuit board 22 is exposed to the bottom 221a of the first concave structure 221. The wall surface 221b has an electroplated layer. When the magnetic core assembly 30 is accommodated within the first concave structure 221 of the printed circuit board 22, the exposed portion of the copper layer and the electroplated layer can increase the heat dissipating capability of the magnetic core assembly 30.

In an embodiment, the magnetic core assembly 30 further includes at least one air gap 30c. As shown in FIGS. 3B and 3C, the magnetic core assembly 30 includes two air gaps 30c. The two air gaps 30c are formed in the corresponding ring-shaped cores 31 and respectively located at two opposite sides of the magnetic core assembly 30. The lateral wall 22c of the printed circuit board 22 includes at least one second concave structure 22e. As shown in FIG. 3C, the lateral wall 22c of the printed circuit board 22 includes two second concave structures 22e. The second concave structures 22e are concavely formed on the second surface 22b of the printed circuit board 22. The second concave structures 22e are aligned with the corresponding air gaps 30c and in communication with the first concave structure 221. Due to the second concave structures 22e, the first concave structure 221 of the printed circuit board 22 can be milled more easily. Moreover, the second concave structures 22e can be used as gas channels for enhancing the heat dissipating capability of the magnetic core assembly 30.

In an embodiment, the ring-shaped cores 31 of the magnetic core assembly 30 are integrally formed as a one-piece structure. Alternatively, the ring-shaped cores 31 are individual components and combined as the magnetic core assembly 30.

In this embodiment, the opening 30b of the magnetic core assembly 30 has a circular shape. The protrusion post 222 penetrating through the corresponding opening 30b also has a circular shape. It is noted that the profiles of the opening 30b and the protrusion post 222 are not restricted. For example, the opening 30b has a rectangular shape or any other appropriate shape, and the protrusion post 222 has the shape matching the opening 30b. The surface 30d of the magnetic core assembly 30 has a circular shape. It is noted that the shape of the surface 30d of the magnetic core assembly 30 is not restricted. The shape of the wall surface 221b of the first concave structure 221 matches the shape of the surface 30d of the magnetic core assembly 30. Consequently, the magnetic core assembly 30 can be tightly fixed within the first concave structure 221 of the printed circuit board 22.

In some embodiments, a protective glue is coated on the surface 30d of the magnetic core assembly 30. When the printed circuit board 22 is subjected to deformation, the protective glue can absorb the tension and pressure on the magnetic core assembly 30. Moreover, the magnetic core assembly 30 is fixed on the bottom 221a of the first concave structure 221 through a thermal adhesive. Consequently, the heat dissipating capability of the magnetic core assembly 30 is enhanced. In some embodiments, there is a first gap 23 between the surface 30d of the magnetic core assembly 30 and the wall surface 221b of the first concave structure 221, and there is a second gap 24 between an inner wall 30e of the magnetic core assembly 30 and the corresponding protrusion post 222. An underfill material is filled in the first gap 23 and the second gap 24. Consequently, the magnetic core assembly 30 and the printed circuit board 22 are contacted with each other through the underfill material. Due to the underfill material, the contact area between the magnetic core assembly 30 and the printed circuit board 22 is increased. Consequently, the heat dissipating capability of the magnetic core assembly 30 is enhanced.

Figure 5:
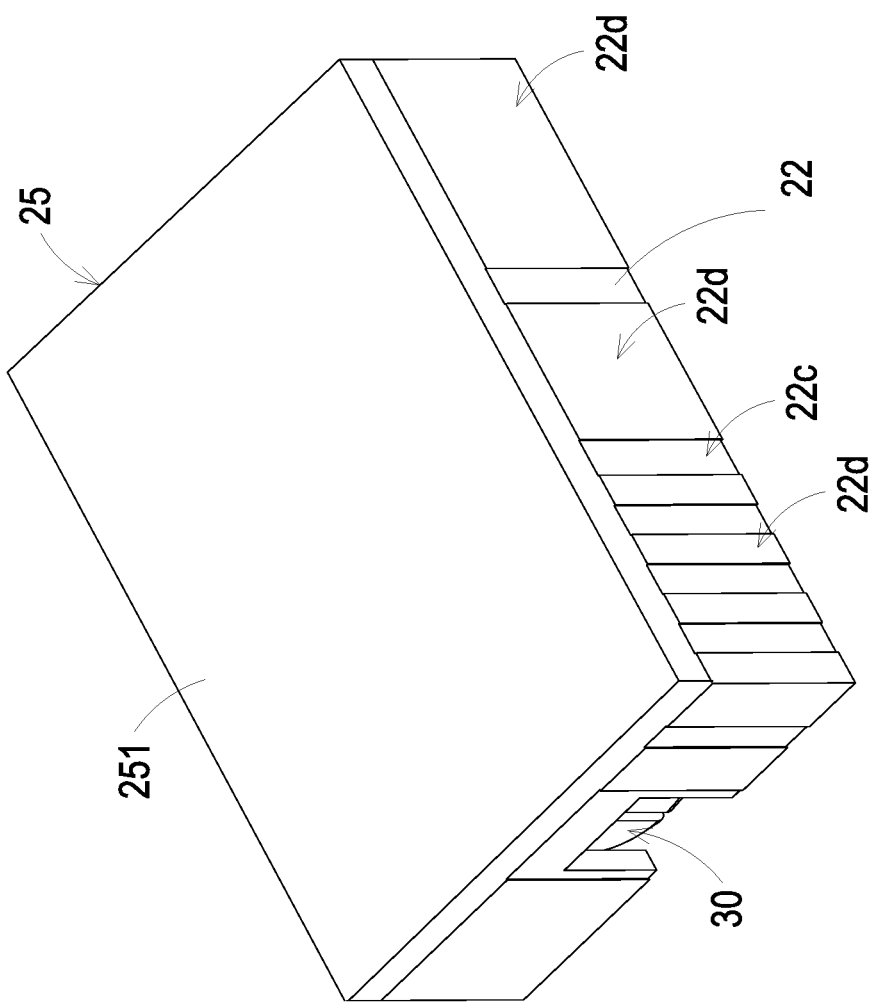
FIG. 5 is a schematic perspective view illustrating the voltage regulator module with a molding compound layer according to the embodiment of the present disclosure.

FIG. 5 is a schematic perspective view illustrating the voltage regulator module with a molding compound layer according to the embodiment of the present disclosure. The voltage regulator module 2 further includes a molding compound layer 25. The molding compound layer 25 is disposed on the first surface 22a of the printed circuit board 22. The first surface 22a of the printed circuit board 22, the Dr.MOS elements 21, the input capacitors Cin and the filter capacitor are encapsulated by the molding compound layer 25 through a plastic molding process. An external surface 251 of the molding compound layer 25 is a flat surface. The external surface 251 is attached and fixed on a casing or a heat sink of the electronic device. Since the external surface 251 is a flat surface, the contact area between the external surface 251 and the casing (or the heat sink) is increased. The increased contact area is helpful to reduce the thermal resistance, increase the heat dissipating capability of the voltage regulator module 2, uniformly distribute the pressure from the casing and increase the pressure resistance of the circuit board assembly 20.

Moreover, after the first surface 22a of the printed circuit board 22, the Dr.MOS elements 21, the input capacitors Cin and the filter capacitor are encapsulated by the molding compound layer 25, the external surface 251 of the molding compound layer 25 is polished. Consequently, the surfaces of the Dr.MOS elements 21 are exposed outside the external surface 251 of the molding compound layer 25. Then, the Dr.MOS elements 21 are indirectly attached on the casing of the electronic device through a heat sink or directly attached on the casing of the electronic device. In such way, the thermal resistance is reduced, and the heat dissipating efficacy is enhanced.

In the above embodiment, the voltage regulator module 2 includes the molding compound layer. The first concave structure 221 of the printed circuit board 22 is concavely formed on the second surface 22b of the printed circuit board 22 by a milling process. The magnetic core assembly 30 is accommodated within the first concave structure 221. Moreover, the voltage regulator module 2 is welded on the system board through the pins on the second surface 22b of the printed circuit board 22. Consequently, when the voltage regulator module 2 on the system board undergoes a reflow soldering process, the inner components to be reheated are not detached or shifted. In other words, the process of fabricating the voltage regulator module 2 is simplified.

From the above descriptions, the present disclosure provides the voltage regulator module. The Dr.MOS elements and the magnetic core assembly are disposed on two opposite sides of the printed circuit board. The protrusion posts of the printed circuit board are used as the windings, and the inductors are defined by the corresponding windings and the magnetic core assembly collaboratively. Consequently, the thickness and the size of the magnetic core assembly can be effectively reduced. Moreover, since the magnetic core assembly is accommodated within the first concave structure of the printed circuit board, the height of the voltage regulator module is substantially equal to the overall height of the printed circuit board and the Dr.MOS elements. While compared with the conventional voltage regulator module, the size of the voltage regulator module of the present disclosure can be further reduced. The first surface of the printed circuit board is encapsulated. The magnetic core assembly is accommodated within the first concave structure on the second surface of the printed circuit board. When the voltage regulator module on the system board undergoes a reflow soldering process, the inner components to be reheated are not detached or shifted. In other words, the process of fabricating the voltage regulator module is simplified.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage regulator module, comprising:
a circuit board assembly comprising a printed circuit board and at least one switch element, wherein the printed circuit board has a first surface and a second surface which are opposed to each other, the printed circuit board comprises a first concave structure and at least one protrusion post, wherein the first concave structure is concavely formed on the second surface of the printed circuit board, the protrusion post is disposed within the first concave structure, and the protrusion post has internal traces, wherein a pin as a positive input terminal, a pin as a positive output terminal and a pin as a negative output terminal of the voltage regulator module are disposed on the second surface of the printed circuit board, and the at least one switch element is disposed on the first surface of the printed circuit board; and a magnetic core assembly accommodated within the first concave structure, and comprising at least one opening, wherein the protrusion post is penetrated through the corresponding opening, so that at least one inductor is defined by the at least one protrusion post and the magnetic core assembly collaboratively.

2. The voltage regulator module according to claim 1, wherein the protrusion post comprises a pin as the positive output terminal.

3. The voltage regulator module according to claim 1, wherein the printed circuit board further comprises a lateral wall, and the lateral wall is arranged between the first surface and the second surface of the printed circuit board, wherein a plurality of electroplated blocks are formed on the lateral wall and aligned with corresponding pins of the positive input terminal and the negative output terminal.

4. The voltage regulator module according to claim 1, wherein a copper layer of the printed circuit board is exposed to a bottom of the first concave structure, and a wall surface of the first concave structure has an electroplated layer.

5. The voltage regulator module according to claim 1, wherein a protective glue is coated on a surface of the magnetic core assembly.

6. The voltage regulator module according to claim 1, wherein the magnetic core assembly is fixed in the first concave structure through a thermal adhesive.

7. The voltage regulator module according to claim 1, wherein a first gap is formed between a surface of the magnetic core assembly and a wall surface of the first concave structure, and a second gap is formed between an inner wall of the magnetic core assembly and the corresponding protrusion post, wherein an underfill material is filled in the first gap and the second gap.

8. The voltage regulator module according to claim 1, further comprising a molding compound layer disposed on the first surface of the printed circuit board, wherein the first surface of the printed circuit board and the at least one switch element are encapsulated by the molding compound layer, and an external surface of the molding compound layer is a flat surface.

9. The voltage regulator module according to claim 1, wherein the at least one switch element comprises two switch elements, the at least one protrusion post comprises two protrusion posts, and the at least one opening comprises two openings, wherein each protrusion post is penetrated through the corresponding opening, and each protrusion post and the magnetic core assembly are collaboratively defined as the corresponding inductor, wherein each switch element and the corresponding inductor are connected with each other in series to form a phase circuit.

10. The voltage regulator module according to claim 9, wherein the two protrusion posts are located at a middle region on the second surface of the printed circuit board, wherein two pins are opposed with respect to the protrusion post and the two pins are used as the negative output terminal.

11. The voltage regulator module according to claim 10, wherein two pins are respectively arranged beside two sides of a region between the two protrusion posts, and the two pins are used as the positive input terminal.

12. The voltage regulator module according to claim 1, wherein the magnetic core assembly comprises at least one air gap.

13. The voltage regulator module according to claim 12, wherein a lateral wall of the printed circuit board comprises at least one second concave structure, wherein the at least one second concave structure is concavely formed on the second surface of the printed circuit board and aligned with the at least one air gap, and the at least one second concave structure is in communication with the first concave structure.

14. The voltage regulator module according to claim 1, wherein the second surface of the printed circuit board further comprises two signal terminals.

15. The voltage regulator module according to claim 1, wherein the magnetic core assembly comprises two ring-shaped cores, and the two ring-shaped cores are integrally formed as a one-piece structure.

16. The voltage regulator module according to claim 1, wherein the voltage regulator module further comprises an input capacitor, and the at least one switch element comprises two switch elements, wherein the at least one input capacitor is disposed on the first surface of the printed circuit board, and arranged between the two switch elements.

* * * * *